(12) United States Patent
Ho et al.

(10) Patent No.: US 7,241,414 B2
(45) Date of Patent: Jul. 10, 2007

(54) METHOD AND APPARATUS FOR MOLDING A SEMICONDUCTOR DEVICE

(75) Inventors: Shu C Ho, Singapore (SG); Teng H Kuah, Singapore (SG); Zhi P Zhang, Singapore (SG); Shuai G Lee, Singapore (SG); Chun Y Li, Singapore (SG); Yi Lin, Singapore (SG)

(73) Assignee: ASM Technology Singapore Pte Ltd., Singapore (SG)

( * ) Notice: Subject to any disclaimer, the term of this patent is extended or adjusted under 35 U.S.C. 154(b) by 329 days.

(21) Appl. No.: 10/876,922

(22) Filed: Jun. 25, 2004

(65) Prior Publication Data

US 2005/0287236 A1 Dec. 29, 2005

(51) Int. Cl.
*B29C 70/72* (2006.01)
*H01L 21/56* (2006.01)

(52) U.S. Cl. .................. 264/272.17; 264/313; 264/316; 425/89; 425/125; 425/127; 438/127

(58) Field of Classification Search ........... 264/272.17, 264/313, 316; 425/89, 125, 127; 438/127
See application file for complete search history.

(56) References Cited

U.S. PATENT DOCUMENTS

| | | | |
|---|---|---|---|
| 4,076,791 A * | 2/1978 | Barter et al. ........... 264/272.15 |
| 5,766,650 A * | 6/1998 | Peters et al. ................. 425/116 |
| 6,100,114 A * | 8/2000 | Milkovich et al. ........... 438/127 |
| 6,554,598 B1* | 4/2003 | Tsuruta ........................ 425/89 |
| 6,674,165 B2 | 1/2004 | Ho et al. ..................... 257/730 |
| 6,817,854 B2* | 11/2004 | Hundt et al. ................ 425/125 |
| 2001/0033876 A1* | 10/2001 | Hirano et al. ............... 425/345 |
| 2002/0015748 A1* | 2/2002 | Miyajima et al. .............. 425/89 |
| 2002/0025352 A1* | 2/2002 | Miyajima ..................... 425/89 |
| 2003/0082854 A1 | 5/2003 | Kasahara et al. ........... 438/123 |
| 2003/0143406 A1* | 7/2003 | Siegel et al. ................ 428/447 |
| 2004/0075184 A1* | 4/2004 | Brown et al. .............. 264/45.1 |

FOREIGN PATENT DOCUMENTS

JP 2002275435 A * 9/2002

\* cited by examiner

*Primary Examiner*—Robert B. Davis
(74) *Attorney, Agent, or Firm*—Ostrolenk, Faber, Gerb & Soffen, LLP

(57) ABSTRACT

A method and apparatus is provided for molding a semiconductor device in a mold including two mold halves. One mold half includes a compressible sealing mechanism constructed and configured to exert a sealing pressure between a surface of the mold half and a surface of a semiconductor device located in the mold. A compliant tape is positionable onto the mold half comprising the sealing mechanism between the semiconductor device and the sealing mechanism for molding of the semiconductor device.

20 Claims, 2 Drawing Sheets

METHOD AND APPARATUS FOR MOLDING A SEMICONDUCTOR DEVICE

FIELD OF THE INVENTION

The invention relates to the molding of a semiconductor device, and in particular, to the molding of a semiconductor such that only one side of the device is molded to produce a semiconductor package, such as a Quad Flat No-Lead ("QFN") package.

BACKGROUND AND PRIOR ART

Molding in a semiconductor lead frame package is performed to protect a semiconductor integrated circuit die attached to a metal lead frame substrate in a conventional packaging process. Molding is carried out in a mold press or molding machine. Typically, the molding machine includes a mold chase with two mold halves, which sandwich the lead frame with the semiconductor dice positioned within cavities formed in the mold halves. Encapsulation material, such as epoxy molding compound ("EMC"), is introduced into the cavity of the mold, thereby encapsulating the semiconductor dice.

One semiconductor package that has been developed fairly recently is the quad, flat, no-lead package sometimes known as a QFN package. A characteristic of a QFN package is that EMC is molded around a semiconductor die on only one side of the lead frame substrate. The opposite side of the substrate is substantially free of EMC. QFN packages generally fall into one of two categories, either matrix QFN or block QFN.

For the matrix QFN package a single die is attached to each die pad and during molding, each die is located within its own mold cavity. Hence, each die is individually encapsulated on the lead frame. After molding, the lead frame is singulated by cutting the metal of the lead frame between each encapsulated die.

As for the block QFN package, the lead frame has separate blocks of die pads to which dice are attached, and each block has a square array of die pads. During molding, all the dice on the die pads in the same block are located in the same mold cavity. Hence, all the dies in the same block are encapsulated in the same block of molding and singulation is performed by cutting through the lead frame and the molding material between the dies in a block.

In both matrix and block QFN packages the overall size of the package is close to the size of the semiconductor chip located within the package. Thus, these packages are also referred to as chip-scale packages. In addition, QFN packages are lead frame based packages and have an exposed die paddle. Hence, QFN packages enable good electrical performance and thermal characteristics, as the exposed die paddle can be used as a ground plane and a heat sink.

However, one problem with QFN packages and other semiconductor packages which are molded on only one side of the substrate, is the problem of epoxy flash seeping onto the other side of the lead frame during the molding operation.

One method that has been developed to avoid the problem of epoxy flash seepage is to paste an adhesive tape to a surface of the lead frame that is to be free of epoxy. This method is described in U.S. Patent Publication No. 2003/0082854A1 entitled, "Lead Frame, Method of Manufacturing the Same, and Method of Manufacturing a Semiconductor Device Using the Same". Mass molding of a lead frame is performed to a lead frame that has an adhesive tape attached to an entire back surface of the lead frame, so as to prevent a leakage of molding resin from the back surface of the lead frame. Generally, the attachment of the adhesive tape to the back surface of the lead frame (taping) is performed prior to the package assembly process.

A problem with this approach is that lead frame warpage may occur during molding due to a difference in the coefficient of thermal expansion between a material constituting the lead frame and the material constituting the adhesive tape. Furthermore, the taping process is relatively expensive because the adhesive tape has to be applied individually to each lead frame prior to the package assembly process. The material cost of the adhesive tape itself (which is not reusable) is also significant. In fact, the disclosure in the aforesaid invention suggests sectioning the adhesive tape into smaller pieces and attaching them to the lead frame, which would further increase the fabrication steps and costs in preparing each piece of lead frame for molding. Furthermore, means must be provided to remove the adhesive tape after molding, and some adhesivity may even remain on the lead frame surface that may adversely affect handling of the lead frame by downstream processes after molding.

An alternative to attaching an adhesive tape to a back surface of each individual lead frame is disclosed in U.S. Pat. No. 6,674,165 entitled, "Mold for a Semiconductor Chip". The said patent provides a mold for a semiconductor chip comprising two mold halves, wherein one mold half comprises sealing means adapted to exert a sealing pressure between a surface of the mold and a surface of a substrate located in the mold during a molding operation. It was found that with a high clamping pressure, a mold surface coated with the sealing means can be effective to prevent the molding compound from seeping into an unmolded surface of the substrate.

The sealing means may comprise an elastically deformable coating which is preferably heat resistant and may be, for example, a silicone or fluorine based rubber coating. It is typically laminated onto the surface of the lower mold half. Nevertheless, it has been found that if molding is performed on the sealing means and there is direct contact of epoxy molding compound ("EMC") on the rubber coating, the EMC will tend to abrade the rubber coating and shorten its useful life span. Once the rubber coating is abraded, it would be necessary to change the coating. That could be expensive and time-consuming.

It would be advantageous to prolong the life of the rubber sealing means without reducing the effectiveness of the sealing means.

SUMMARY OF THE INVENTION

It is thus an object of the present invention to provide an apparatus and method to mold substrates using sealing mechanism comprised on a surface of a mold, wherein the useful life of the sealing mechanism may be prolonged.

According to a first aspect of the invention, there is provided an apparatus for molding a semiconductor device comprising: a mold including two mold halves, one mold half comprising a compressible sealing mechanism constructed and configured to exert a sealing pressure between a surface of the mold half and a surface of a semiconductor device located in the mold; and a compliant tape positionable onto the mold half comprising the sealing mechanism between the semiconductor device and the sealing mechanism.

According to a second aspect of the invention, there is provided a method for molding a semiconductor device comprising the steps of: providing a mold including two mold halves; constructing a compressible sealing mechanism on one mold half; positioning a compliant tape onto the mold half comprising the sealing mechanism; placing a semiconductor device into the mold so that the compliant tape is between the semiconductor device and the sealing mechanism; and molding the semiconductor device in the mold while exerting a sealing pressure between the sealing mechanism and compliant tape against a surface of the semiconductor device.

It would be convenient hereinafter to describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of an apparatus and method in accordance with the invention will now be described with reference to the accompanying drawings, in which.

DETAILED DESCRIPTION OF THE PREFERRED EMBODIMENT

Figure 1:
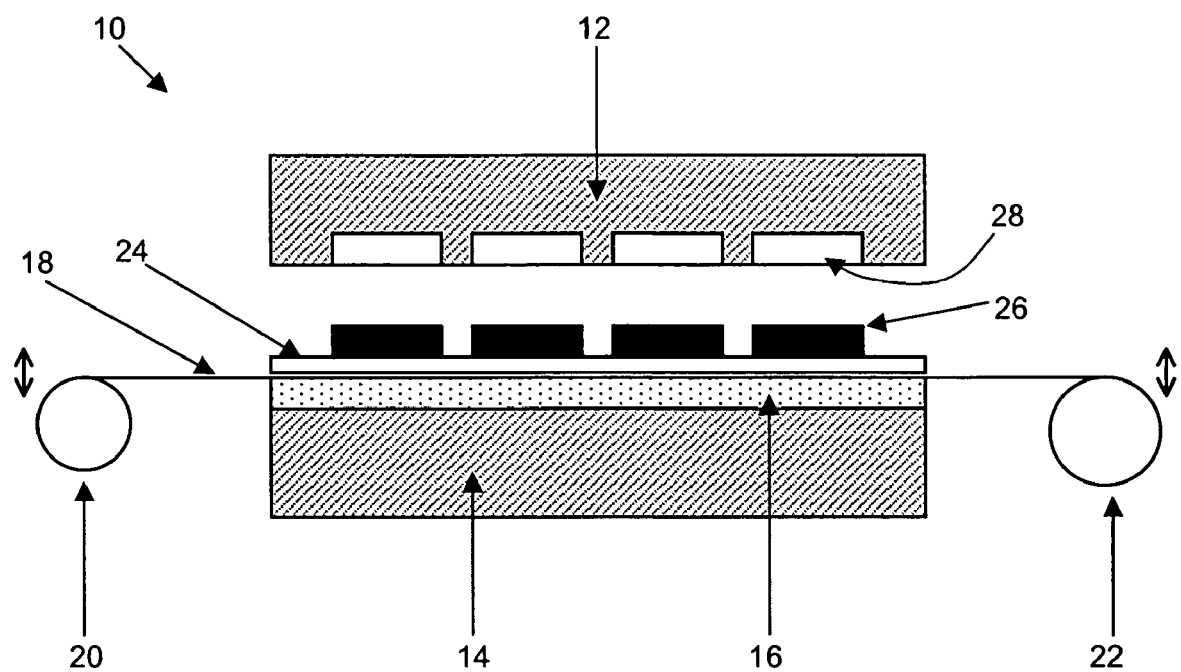
FIG. 1 is a cross-sectional side view of a molding apparatus according to the preferred embodiment of the invention.

FIG. 1 is a cross-sectional side view of a molding apparatus 10 or mold according to the preferred embodiment of the invention. The molding apparatus 10 comprises two mold halves, which may be in the form of a top mold 12 which is movable relative to a bottom mold 14. A sealing mechanism 16, such as a coating of elastically deformable rubber material, is applied to the top surface of one mold half, such as the bottom mold 14. The coating is configured to exert a sealing pressure between the surface of the bottom mold 14 and a surface of a semiconductor device located in the molding apparatus 10 for molding.

In addition, a layer of compliant film or tape 18 is placed onto the sealing mechanism 16. The tape 18 may be made of a plastic material, most preferably polyimide, or Teflon. The plastic material or Teflon should be of a type that is substantially resistant to abrasion by the EMC. The compliant tape 18 should be re-useable to last multiple molding shots, preferably at least five molding shots, before requiring a change of tape 18, if at all. During molding, the compliant tape 18 is located between the semiconductor device and the sealing mechanism 16. The tape 18 acts as a protective shield over the sealing mechanism 16, and is meant to be replaceable with a new sheet of tape material when the tape 18 is sufficiently worn-out.

While it is possible to manually place the tape 18 over the sealing mechanism 16 prior to conducting multiple molding shots, it is preferable that the changing process is automated. Therefore, it is also desirable to include a tape changing mechanism for automatically changing a section of compliant tape 18 placed on the sealing mechanism. The tape changing mechanism may comprise a tape supply module 20 located on one side of the molding apparatus 10 that includes a reel of tape 18 that can continuously supply a length of tape 18 to the molding apparatus 10. The tape 18 can be coupled to a tape collector module 22 located on an opposite side of the molding apparatus 10 that also comprises a tape reel for collecting tape 18. The tape supply module 20 should preferably be configured to store a sufficient length of unused compliant tape 18 to repeatably supply unused tape 18 to the molding apparatus 10.

After a predetermined number of molding shots are conducted, the tape supply module 20 and tape collector module 22 can be activated to move the tape 18 so as to position a fresh, unused section of tape 18 over the sealing mechanism 16. One method of activating the tape supply 20 and tape collector 22 modules is to utilize a separation device to first separate the tape 18 from the sealing mechanism 16. The separation device might function by lifting the modules 20, 22 to an elevated height before the respective tape reels are rotated, for example, in the clockwise direction of the embodiment in FIG. 1. After rotation of the reels by a certain distance, the modules 20, 22 can be lowered again to set the tape on the bottom mold 14.

After a section of tape 18 is positioned over the sealing mechanism 16, a substrate such as a lead frame 24 is placed onto the bottom mold 14 on top of the tape 18. The tape 18 is thus positioned between the lead frame 24 to be molded and the sealing mechanism 16. The top mold 12, which has a number of molding cavities 28 corresponding to molding areas for the dice, is lowered onto the lead frame 24, and presses against the lead frame 24. The molding cavities 28 are then filled with EMC material 26, and the EMC material 26 is allowed to harden. The top mold 12 is then lifted away from the lead frame 24. Molded blocks comprising EMC 26 are thereby formed on only the top surface of the lead frame 24. The sealing mechanism 16, in conjunction with the tape 18, prevent seepage of EMC into the bottom surface of the lead frame 24.

After molding, the lead frame 24 is removed from the bottom mold 14, a new lead frame is placed onto the bottom mold 14, and the molding process is repeated with another molding shot. A predetermined number of molding shots are carried out on the same section of tape 18 over the sealing mechanism until it is necessary to use a new section of tape 18. At that point, the tape supply module 20 and tape collector module 22 are activated so that the used section of tape 18 is moved away from the sealing mechanism 16 and a new section of tape 18 is placed over the sealing mechanism 16. Thereafter, a new lead frame 24 can be placed onto the bottom mold 14 and the process may be repeated for another predetermined number of molding shots.

Figure 2:
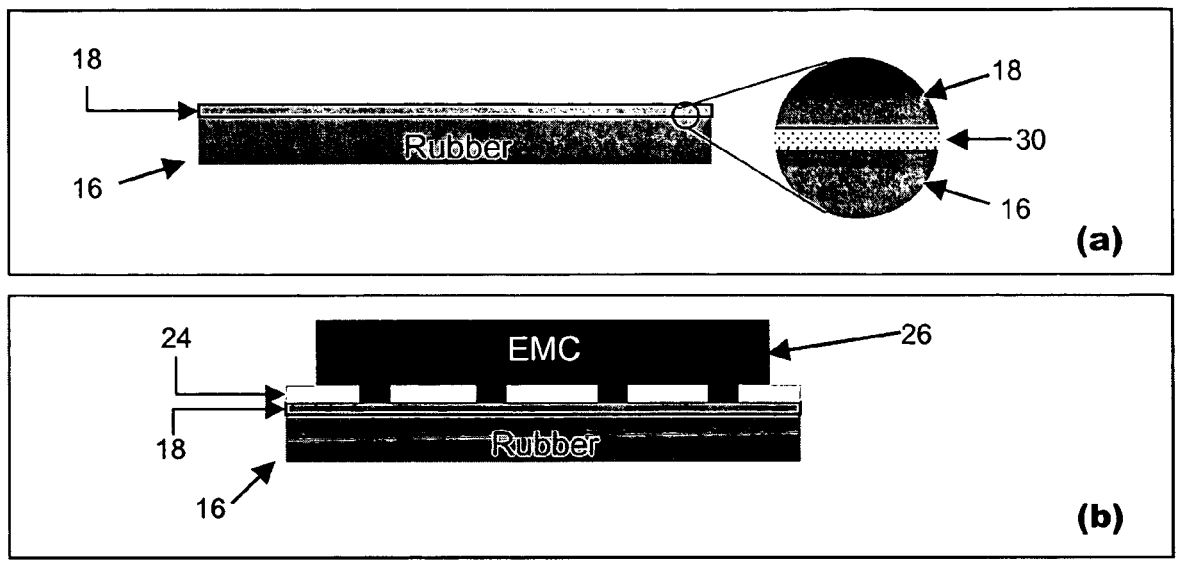
FIG. 2 are cross-sectional side views of (a) a sealing mechanism including a layer of tape placed over the sealing mechanism before molding, and (b) a lead frame encapsulated with EMC after molding with the sealing mechanism respectively.

FIG. 2(a) is a cross-sectional side view of a sealing mechanism 16 including a layer of tape 18 placed over the sealing mechanism 16 before molding. There is preferably a layer of adhesive compound 30 between the compliant tape 18 and sealing mechanism 16. Most preferably, the adhesive compound 30 is comprised in a surface of the tape 18 facing the sealing mechanism 16. The adhesive compound 30 promotes adhesion between the sealing mechanism 16 and the tape 18 to avoid unnecessary movement of the tape 18 before and during the molding process. However, the tape 18 may also function without the adhesive compound 30 since the tape supply module 20 and the tape collector module 22 also serve to hold each section of tape 18 in position.

FIG. 2(b) is a cross-sectional view of a lead frame 24 encapsulated with EMC 26 after molding with the sealing mechanism 16. The EMC 26 selectively covers the top surface of the lead frame 24 as guided by the positions of the molding cavities 28 and enters and fills crevices of the lead frame 24, but is prevented from covering the bottom surface of the lead frame 24 by the sealing mechanism 16 in conjunction with the tape 18. The tape 18 does not adversely affect the reliability of the sealing mechanism 16 to prevent seepage of EMC to the bottom surface, but serves to protect the sealing mechanism 16 from abrasion by the EMC 26.

Figure 3:
FIG. 3 shows a schematic overview of the primary components of a molding system incorporating the molding apparatus according to the preferred embodiment of the invention.

FIG. 3 shows a schematic overview of the primary components of a molding system incorporating the molding apparatus 10 according to the preferred embodiment of the invention. Lead frames 24 to be molded are introduced into an input module 32 for preheating before being transferred together with EMC via an input module 32 to the molding apparatus 10 for molding. Molding is performed at the molding apparatus 10 as described above. After molding, the lead frames 24 are removed from the bottom mold 14 to an output module 34. At the output module 34, encapsulated lead frames may be inspected for defects such as flash, voids, incomplete fill and others. The gate and runner cull formed during molding are typically also removed at this output module 34.

A tape supply module 20 supplies tape 18 to the molding apparatus 10, preferably from a reel of tape 18, to aid in the molding process, and a tape collector module 22 collects used tape 18 from the molding apparatus 10 as described above. From the output module 34, the lead frames 24 may be further transferred to a de-flash module 36. The de-flash module 36 includes a de-flashing device for removing any mold flash and/or bleed. Mold flash and/or bleed removal may be accomplished with the use of an abrasive medium. Accordingly, the lead frame may be blasted with an abrasive compound such as plasma gas or other abrasives, in order to remove any flash or bleed that manages to seep through to the unmolded surface of the lead frame 24 notwithstanding the sealing pressure exerted by the sealing mechanism in the mold.

The invention described herein is susceptible to variations, modifications and/or additions other than those specifically described and it is to be understood that the invention includes all such variations, modifications and/or additions which fall within the spirit and scope of the above description.

The invention claimed is:

1. An apparatus for molding a semiconductor device comprising:
    a mold including two mold halves, one mold half comprising a compressible sealing mechanism constructed and configured to exert a sealing pressure between a surface of the mold half and a surface of a semiconductor device located in the mold that is not encapsulated during molding; and
    a compliant tape positionable onto the mold half comprising the sealing mechanism between the semiconductor device and the sealing mechanism;
    wherein the compressible sealing mechanism comprises a coating of elastically deformable material applied to a top surface of the mold half that is coextensive with at least the whole surface of the semiconductor device that is not molded.

2. The apparatus according to claim 1, including a layer of adhesive compound between the compliant tape and the sealing mechanism.

3. The apparatus according to claim 2, wherein the adhesive compound is comprised in a surface of the tape.

4. The apparatus according to claim 1, wherein the compliant tape is made of plastic material or polytetrafluoroethylene.

5. The apparatus according to claim 4, wherein the plastic material comprises polyimide.

6. The apparatus according to claim 1, wherein the compliant tape is substantially resistant to abrasion by epoxy molding compound.

7. The apparatus according to claim 1, wherein the compliant tape is fabricated to be reusable to last for multiple molding shots.

8. The apparatus according to claim 7, wherein the compliant tape is fabricated to last at least five molding shots.

9. The apparatus according to claim 1, including a tape changing mechanism to automatically change a section of compliant tape positioned on the mold half after a molding shot.

10. The apparatus according to claim 9, wherein the tape changing mechanism comprises a tape supply module located on one side of the mold and a tape collector module located on an opposite side of the mold.

11. The apparatus according to claim 10, wherein each of the tape supply module and the tape collector module comprises a tape reel.

12. The apparatus according to claim 10, wherein the tape supply module is configured to store a sufficient length of unused compliant tape to repeatably supply unused tape to the mold.

13. The apparatus according to claim 12, including a device for activating the tape supply and tape collector modules to automatically position a section of unused tape onto the mold.

14. The apparatus according to claim 13, including a separation device for separating the compliant tape away from the sealing mechanism prior to activating the tape supply and tape collector modules.

15. A method for molding a semiconductor device comprising the steps of:
    providing a mold including two mold halves;
    constructing a compressible sealing mechanism on one mold half;
    positioning a compliant tape onto the mold half comprising the sealing mechanism;
    placing a semiconductor device into the mold so that the compliant tape is between a surface of the semiconductor device and the sealing mechanism; and
    molding the semiconductor device in the mold while exerting a sealing pressure between the sealing mechanism and compliant tape against a surface of the semiconductor device;
    wherein the compressible sealing mechanism comprises a coating of elastically deformable material applied to a top surface of the mold half at least coextensive with at least the whole surface of the semiconductor device that is not molded.

16. The method according to claim 15, wherein the compliant tape is made of plastic material or polytetrafluoroethylene.

17. The method according to claim 15, wherein the compliant tape is substantially resistant to abrasion by epoxy molding compound.

18. The method according to claim 15, including maintaining substantially the same section of compliant tape over the sealing mechanism for multiple molding shots.

19. The method according to claim 18, including the step of automatically changing the section of compliant tape after said multiple molding shots.

20. The method according to claim 19, wherein the compliant tape is replaced by another section of compliant tape from a single strip of compliant tape.

* * * * *

UNITED STATES PATENT AND TRADEMARK OFFICE
CERTIFICATE OF CORRECTION

PATENT NO. : 7,241,414 B2  Page 1 of 1
APPLICATION NO. : 10/876922
DATED : July 10, 2007
INVENTOR(S) : Ho et al.

It is certified that error appears in the above-identified patent and that said Letters Patent is hereby corrected as shown below:

On Title Page
Item (75) Inventors: should read
    Shu Cheun Ho, Singapore (SG); Teng Hock Kuah, Singapore (SG);
    Zhi Pan Zhang, Singapore (SG); Shuai Ge Lee, Singapore (SG); Chun
    Yu Li, Singapore (SG); Yi Lin, Singapore (SG).

Signed and Sealed this

Thirteenth Day of November, 2007

JON W. DUDAS
*Director of the United States Patent and Trademark Office*